United States Patent
Bayruns et al.

(10) Patent No.: US 8,461,931 B1
(45) Date of Patent: Jun. 11, 2013

(54) WIDEBAND RF POWER AMPLIFIER FOR MULTI-MODE MULTI-BAND APPLICATIONS

(75) Inventors: Robert J. Bayruns, Marietta, GA (US); John VanSaders, Asbury, NJ (US)

(73) Assignee: Anadigics, Inc., Warren, NJ (US)

( * ) Notice: Subject to any disclaimer, the term of this patent is extended or adjusted under 35 U.S.C. 154(b) by 0 days.

(21) Appl. No.: 13/284,290

(22) Filed: Oct. 28, 2011

Related U.S. Application Data (60) Provisional application No. 61/408,885, filed on Nov. 1, 2010.

(51) Int. Cl.
*H03F 3/04* (2006.01)
(52) U.S. Cl.
USPC .............................. 330/297; 330/127; 330/279
(58) Field of Classification Search
USPC ................. 330/297, 285, 302, 127, 129, 134, 330/279
See application file for complete search history.

(56) References Cited

U.S. PATENT DOCUMENTS 7,876,156 B2 * 1/2011 Tanaka et al. ................. 330/285

* cited by examiner

*Primary Examiner* — Hieu Nguyen
(74) *Attorney, Agent, or Firm* — William L. Botjer (57) ABSTRACT

A Multi-Mode Multi-Band (MMMB) radio frequency (RF) power amplifier circuit operating at multiple frequency bands. The power amplifier circuit comprises a single wideband power amplifier having high output impedance which is configured to be equal to a load impedance of the load connected to the power amplifier circuit. A bias voltage applied to the wideband power amplifier is changed from a first value to a second value to provide a predetermined output power of the wideband power amplifier to the load with the output impedance of wideband power amplifier being equal to the load impedance. The power amplifier circuit also includes an individual harmonic filter for filtering each frequency band independently.

19 Claims, 4 Drawing Sheets

WIDEBAND RF POWER AMPLIFIER FOR MULTI-MODE MULTI-BAND APPLICATIONS

TECHNICAL FIELD

The present invention generally relates to the field of radio frequency (RF) power amplifiers. More specifically, it relates to RF power amplifier for Multi-Mode Multi-Band (MMMB) applications.

BACKGROUND OF THE INVENTION

Radio Frequency (RF) power amplifiers are used in mobile communication devices such as cellular telephones, smart phones, personal digital assistants (PDAs), etc. for amplifying and transmitting a RF signal from the mobile communication device. In addition to the basic function of receiving and making calls from and to other mobile communication devices, the communication devices also supports a variety of services such as messaging, downloading data, images and videos, internet browsing, audio and video playback, email access, etc. To provide such services, the mobile communication device requires operation over a wide range of frequencies.

Further, in order to increase the communication bandwidth and to provide efficient communication, different communication standards have evolved. Current communication standards include Global System for Mobile communications (GSM), Universal Mobile Telecommunications System (UMTS), Long Term Evolution (LTE), Enhanced Data rates for GSM Evolution (EDGE), etc. Each communication standard has a defined signal specification, modulation type, transmission power requirements, operating frequency bands, etc. Moreover, the operating frequency range of the communication standards varies from one geography to another across the globe. In order to provide global roaming facility for users of the mobile communication devices, there is a need for providing mobile communication devices which enable various communication standards to co-exist and provide interoperability between multiple frequency bands. A mobile communication device which can operate at multiple frequency bands and across multiple communication standards is generally referred to as a Multi-Mode Multi-Band (MMMB) communication device.

Figure 1:
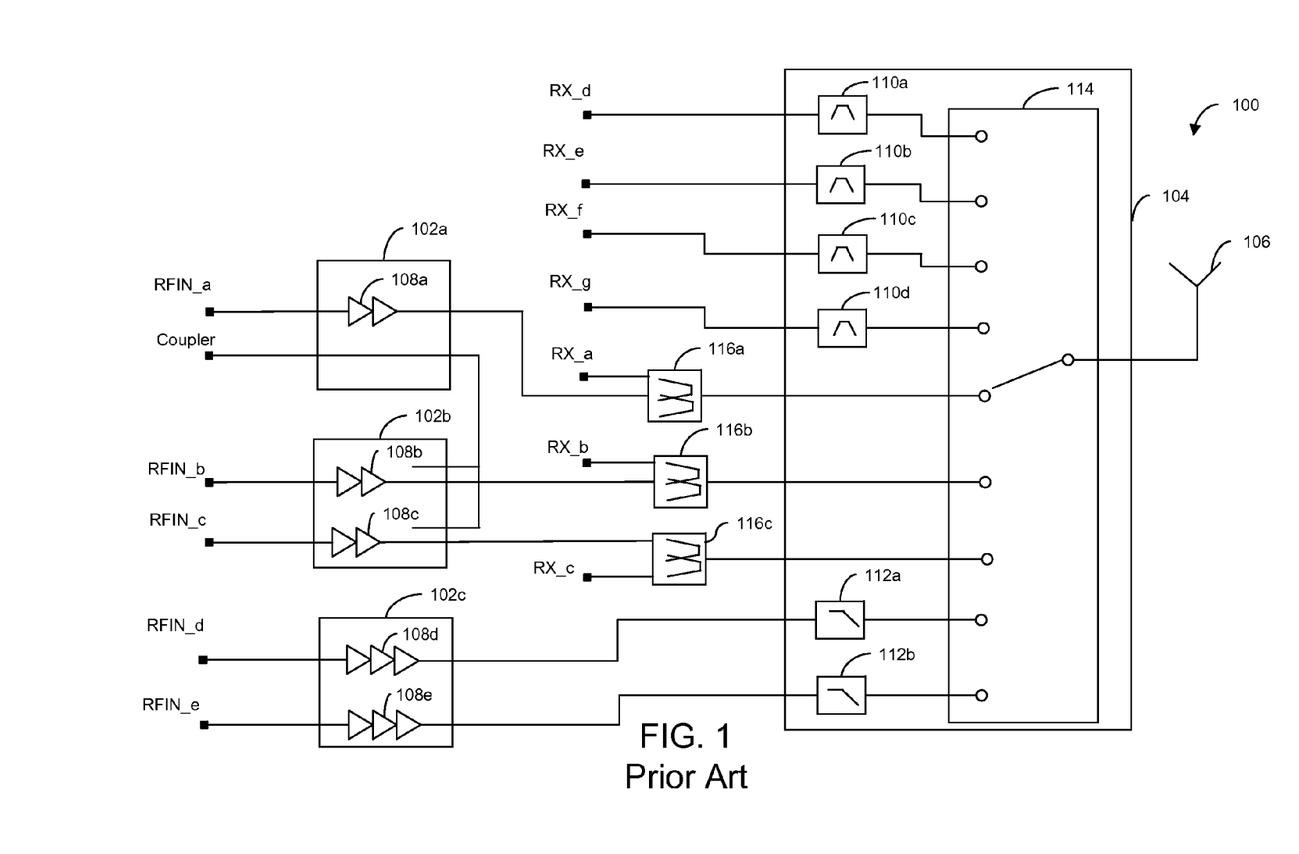
FIG. 1 illustrates a conventional MMMB RF power amplifier circuit in accordance with an embodiment of the present invention.

The existing technologies that enable multi-mode multi-band operation of a mobile communication device includes a Multi-Mode Multi-Band (MMMB) RF power amplifier circuit in the mobile communication device. The existing MMMB RF power amplifier circuits include a separate low voltage, low impedance RF amplifier for each operating frequency range. For example, for a dual frequency band operation, the existing MMMB RF power amplifier circuits require two low voltage, low impedance power amplifiers. One exemplary MMMB RF power amplifier circuit for amplifying five frequency bands is shown in FIG. 1. Hereinafter, an operating frequency band is interchangeably referred to as RF input signal.

FIG. 1 illustrates a conventional MMMB RF power amplifier circuit 100. Power amplifier circuit 100 comprises power amplifier modules 102a, 102b and 102c, an antenna switch 104, an antenna 106 and third harmonic filters 116a, 116b and 116c. Power amplifier module 102a comprises a power amplifier 108a, power amplifier module 102b comprises a power amplifier 108b and a power amplifier 108c and power amplifier module 102c comprises a power amplifier 108d and a power amplifier 108e. Antenna switch 104 includes first harmonic filters 110a, 110b, 110c and 110d, second harmonic filters 112a and 112b and a switch 114.

RF input signals RFIN_a, RFIN_b, RFIN_c, RFIN_d and RFIN_e are applied to an input terminal of power amplifiers 108a, 108b, 108c, 108d and 108e respectively. An output terminal of power amplifiers 108a, 108b and 108c are respectively connected to an input terminal of each of third harmonic filters 116a, 116b and 116c. Further, a coupler is connected to an output terminal of power amplifier modules 102a and 102b. Furthermore, an output terminal of power amplifiers 108d and 108e are respectively connected to an input terminal of each of second harmonic filters 112a and 112b. An output terminal of each of third harmonic filters 116a, 116b and 116c and an output terminal of each of second harmonic filters 112a and 112b are respectively connected to separate input ports of switch 114 of antenna switch 104. An output port of switch 114 of antenna switch 104 is connected to antenna 106. Moreover, an output terminal of first harmonic filters 110a, 110b, 110c and 110d are respectively connected to separate input ports of switch 114 of antenna switch 104. An input terminal of first harmonic filters 110a, 110b, 110c and 110d are respectively connected to receiver ports RX_d, RX_e, RX_f and RX_g. Also, a first terminal of third harmonic filters 116a, 116b and 116c are respectively connected to receiver ports RX_a, RX_b and RX_c.

Power amplifier circuit 100 operates both in transmitter mode and a receiver mode. For operation as the transmitter, power amplifier circuit 100 receives RF input signals and transmits the amplified RF input signals to antenna 106. For operating as a receiver, power amplifier circuit 100 receives RF signals from antenna 106 and transmits RF signals to receiver ports RX_a, RX_b, RX_c, RX_d, RX_e, RX_f and RX_g. Power amplifier 108a amplifies the RF input signal RFIN_a, power amplifier 108b amplifies the RF input signals RFIN_b, power amplifier 108c amplifies the RF input signals RFIN_c, power amplifier 108d amplifies the RF input signals RFIN_d and power amplifier 108e amplifies the RF input signals RFIN_e respectively. Hence, power amplifier circuit 100 receives five frequency bands and includes five power amplifiers for amplifying each frequency band when operating as a transmitter.

Power amplifier circuit 100 further includes antenna switch 104 for selectively connecting RF signals to and from antenna 106. Antenna switch 104 includes first harmonic filters 110a, 110b, 110c and 110d which filter a corresponding RF signal received from antenna 106 through switch 114. The filtered RF signals are respectively transmitted from first harmonic filters 110a, 110b, 110c and 110d to the corresponding receiver ports RX_d, RX_e, RX_f and RX_g when operating as a receiver. Antenna switch 104 further includes second harmonic filters 112a and 112b which filter RF input signal RFIN_d and RFIN_e and transmit them to antenna 106 through switch 114 when operating as transmitter.

Power amplifier circuit 100 further includes third harmonic filters 116a, 116b and 116c which filter RF input signal RFIN_a, RFIN_b and RFIN_c and transmit them to antenna 106 through switch 114 when operating as transmitter. Further, third harmonic filters 116a, 116b and 116c filter a corresponding RF signal received from antenna 106 through switch 114 and respectively transmit the filtered RF signals to the corresponding receiver ports RX_a, RX_b, and RX_c when operating as a receiver.

Although FIG. 1 illustrates a MMMB power amplifier circuit 100 having five power amplifiers for amplifying five RF input signals, however the number of power amplifiers is not limited to five. The number of power amplifiers used in a MMMB power amplifier circuit increases with increase in the number of operating frequency bands required. As a result, the complexity of design and size of the MMMB power amplifier circuit and hence size of mobile communication devices in which the MMMB power amplifier circuit is used also increases.

Moreover, the existing MMMB power amplifier circuits include power amplifiers which have low output impedance and operate off a low voltage power supply such as a battery of the mobile communication device. Amplification efficiency of the power amplifier is maximized to extend the duration for which the power supply such as the battery of the mobile communication device can operate, hereinafter referred to as battery life. The efficiency of a power amplifier depends on the output power delivered by the power amplifier to a load. The output power of a power amplifier ($P_{out}$) is a function of a bias voltage ($V_{cc}$) applied to the power amplifier and the output impedance ($R_s$) of the power amplifier. The output power of the power amplifier can be expressed by equation 1 as:

$$P_{out}=V_{cc}^2/(2R_S)$$

For example, when the output power ($P_{out}$) required from a power amplifier is 4 W and the bias voltage ($V_{cc}$) provided by the power supply is 3.6V, the output impedance ($R_S$) of the power amplifier is 1.62 ohm according to equation 1.

To maximize the output power ($P_{out}$) delivered by the power amplifier, the output impedance ($R_S$) of the power amplifier should be equal to a load impedance ($R_L$) of the load. The value of the load impedance depends on a return loss at an output terminal of the power amplifier. For the existing RF communication technologies, the load impedance is generally 50 ohm when the return loss at the output of the power amplifier is less than −10 decibels, i.e. ⊖10 db.

As described above, to provide 4 W output power the output impedance ($R_S$) of the power amplifier is 1.62 ohm which is unequal to the 50 ohm load impedance. As a result, impedance matching is required to make the output impedance ($R_S$) of the power amplifier equal to the load impedance ($R_L$) of the load. Usually, an impedance matching circuit comprising of one or more series inductors, one or more shunt capacitors or a combination thereof is used for transforming the load impedance ($R_L$) of the load to match the output impedance ($R_S$) of the power amplifier. The series inductors used in the impedance matching circuits consume power and reduce the amplification efficiency of the power amplifier. For matching high load impedance to a low output impedance of power amplifier, a large value of additional impedance will be required. Adding a series inductor with large impedance will result in more power loss and hence reduced efficiency of the power amplifier circuit. As a result, the battery life will be reduced and the power source will require frequent charging.

Moreover, the impedance matching circuits operates over a narrow frequency band. For example, a combination of series inductors and shunt capacitors selected for a low frequency band do not allow operation at high frequency bands. As a result, the power amplifier will not be able to operate as a multimode multiband power amplifier. Further, the series inductor occupies a large space when fabricated on a semiconductor die which increases the overall size of the power amplifier circuit. As a result, the size of the mobile communication device also increases. However, the existing technologies for making the mobile communication devices focus on reducing the size of the mobile communication device.

In view of the above, there is a need for a compact multimode multiband power amplifier having simple design and fabrication. Further, a need exists for a multimode multiband power amplifier having high impedance which eliminates the need of impedance matching for maximizing the output power of the power amplifier.

SUMMARY OF THE INVENTION

An object of the present invention is to provide a RF power amplifier circuit which can operate at multiple frequency bands and multiple communication standards.

Another object of the present invention is to provide a multimode multiband RF power amplifier circuit which eliminates the need of impedance matching for maximizing the output power of the power amplifier.

Another object of the present invention is to provide a compact power amplifier circuit having a single power amplifier capable of operating at multiple frequency bands and multiple communication standards.

In accordance with the objects of the invention, various embodiments of the invention provide a power amplifier circuit for amplifying at least one radio frequency (RF) signal applied to an output load. The power amplifier circuit is configured for operating at plurality of frequency bands. The power amplifier circuit comprises a power controller and a wideband power amplifier. The wideband power amplifier is configured to have a constant output impedance which is equal to a load impedance of the output load. The power controller is configured for changing a bias voltage provided by a power supply to the wideband power amplifier. The output impedance of the wideband power amplifier remains equal to the load impedance of the output load when the power controller changes the bias voltage from a first voltage level to a second voltage level.

In accordance with the objects of the invention, various embodiments of the invention provide a multimode multiband radio frequency power amplifier circuit for amplifying at least one radio frequency (RF) signal applied to an output load. The power amplifier circuit comprises a wideband power amplifier, a DC-DC boost converter, a plurality of harmonic filters and a plurality of output switches. The wideband power amplifier is configured for providing a predetermined output power to the output load. The wideband power amplifier has an output impedance and receives a bias voltage from a power supply. The DC-DC boost converter increases the bias voltage received by the wideband power amplifier from a first voltage level to a second voltage level equal to the bias voltage required by the wideband power amplifier for providing the predetermined output power with the output impedance of the wideband power amplifier being equal to a first load impedance of the output load. Each harmonic filter of the plurality of harmonic filters is configured for filtering a pre-defined frequency band corresponding to the each harmonic filter. Each output switch of the plurality of output switches allows the each harmonic filter of the plurality of harmonic filters to receive the corresponding pre-defined frequency band from the output of the wideband power amplifier.

BRIEF DESCRIPTION OF THE DRAWINGS

The following detailed description of the embodiments of the present invention will be better understood when read in conjunction with the appended drawings. The present invention is illustrated by way of example, and not limited by the accompanying figures, in which like references indicate similar elements.

DESCRIPTION OF THE PREFERRED EMBODIMENTS

Various embodiments of the invention provide a Multimode Multi-band (MMMB) power amplifier circuit for amplifying a RF signal applied to a load. The power amplifier circuit includes a wide band power amplifier and a boost DC-DC converter. The wideband power amplifier is configured to have high output impedance equal to a load impedance of the load. A bias voltage applied to the wideband power amplifier is increased by the boost DC-DC converter to a voltage required by the wideband power amplifier to provide a predetermined output power to the load with the output impedance being equal to the load impedance of the load. The power amplifier circuit further includes plurality of switches coupled to the output terminal of the wideband power amplifier. Each switch of the plurality of switches connects a plurality of harmonic filters to the output terminal of the wideband power amplifier for filtering a corresponding frequency band.

Figure 2:
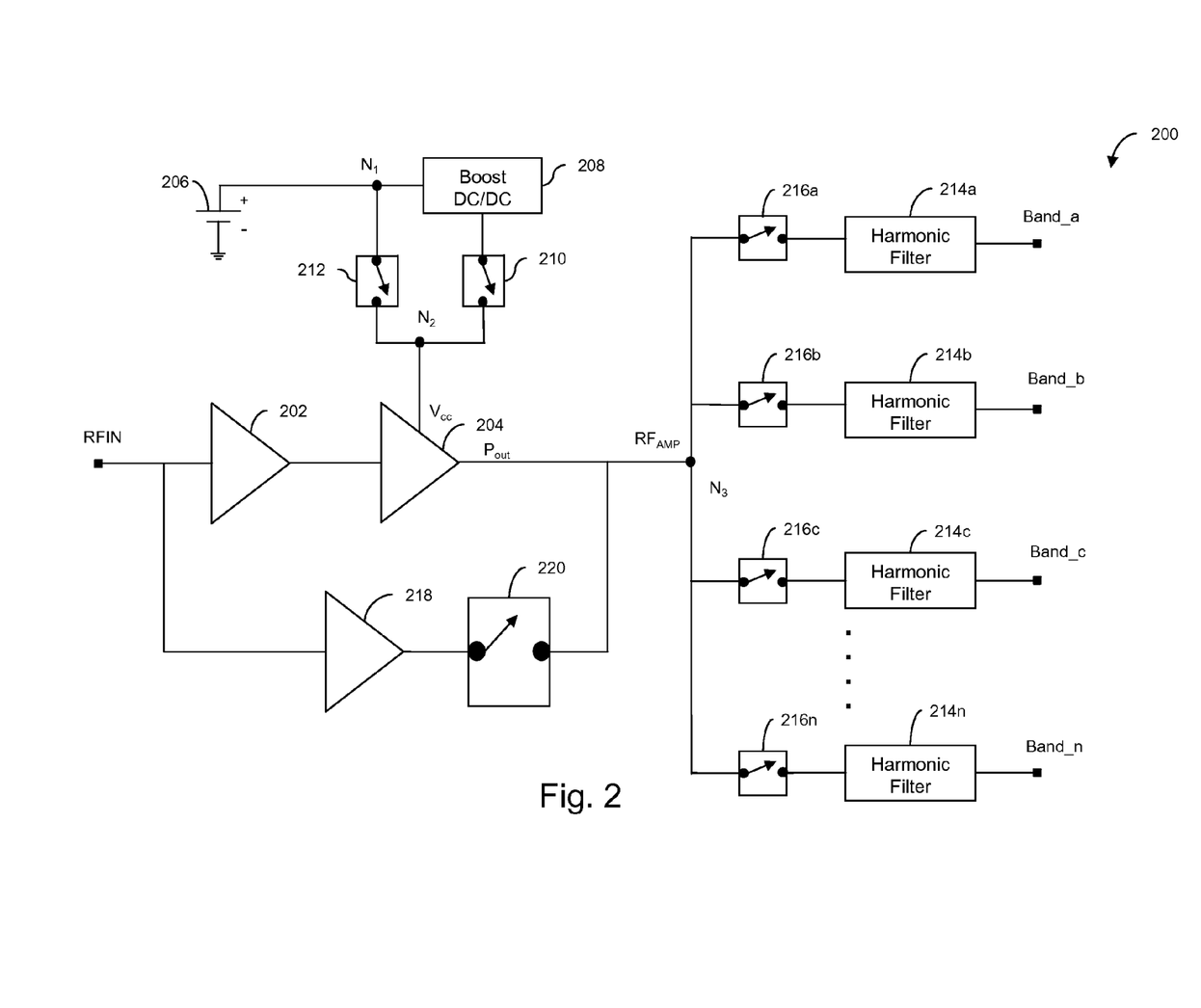
FIG. 2 is a schematic circuit diagram of a MMMB RF power amplifier circuit in accordance with an embodiment of the present invention.

FIG. 2 is a schematic representation of a circuit diagram of a MMMB RF power amplifier circuit 200, in accordance with an embodiment of the invention. Power amplifier circuit 200 is configured for operating at a plurality of frequency bands. Power amplifier circuit 200 includes a voltage gain control amplifier 202, a wideband power amplifier 204, a power supply 206, a power controller 208, a first switch 210, a second switch 212, a plurality of harmonic filters 214a, 214b, 214c and 214n, a plurality of output switches 216a, 216b, 216c and 216n, a secondary power amplifier 218 and a secondary switch 220.

A radio frequency (RF) input signal RFIN to be amplified is applied to an input terminal of voltage gain control amplifier 202. An input terminal of wideband power amplifier 204 is coupled to an output terminal of voltage gain control amplifier 202. A first terminal of power supply 206 is connected to a ground. A second terminal of power supply 206 is connected to a first common node $N_1$. A first terminal of a power controller 208 is connected to the first common node $N_1$. A second terminal of power controller 208 is connected to a first terminal of first switch 210. A second terminal of first switch 210 is connected a second common node $N_2$. The second common node $N_2$ is connected to a bias terminal of wideband power amplifier 204. Further, a first terminal of a second switch 212 is also connected to the first common node $N_1$. A second terminal of second switch 212 is connected to the second common node $N_2$ such that first switch 210 and second switch 212 are connected in parallel. Moreover, an output terminal of wideband power amplifier 204 is coupled to a third common node $N_3$. A first terminal of each output switch of plurality of output switches 216a, 216b, 216c and 216n is connected to the third common node $N_3$. A second terminal of the each output switch of plurality of output switches 216a, 216b, 216c and 216n are coupled to an input terminal of each harmonic filter of harmonic filters 214a, 214b, 214c and 214n. An output terminal of the each harmonic filter of harmonic filters 214a, 214b, 214c and 214n respectively provides an output RF signal Band_a, Band_b, Band_c and Band_n to an output load. Each output RF signal Band_a, Band_b, Band_c and Band_n corresponds to a predefined frequency band corresponding to the each harmonic filter. Further, the RF input signal RFIN to be amplified is also applied to an input terminal of secondary power amplifier 218. An output terminal of secondary power amplifier 218 is connected to a first terminal of secondary switch 220. A second terminal of secondary switch 220 is coupled to the third common node $N_3$ such that a combination of secondary power amplifier 218 and secondary switch 220 is parallel to a combination of voltage gain control amplifier 202 and wideband power amplifier 204.

The RF input signal RFIN to be amplified includes at least one frequency band over which the power amplifier circuit is configured to operate. In an embodiment of the present invention, wideband power amplifier 204 receives the RF input signal RFIN from voltage gain control amplifier 202. Wideband power amplifier 204 amplifies the RF input signal RFIN and the amplified RF input signal $RF_{AMP}$ is applied to a harmonic filter corresponding to the RF input signal RFIN through a corresponding output switch. In an embodiment of the present invention, wideband power amplifier 204 comprises at least one transistor selected from a group consisting of: Gallium Arsenide Pseudomorphic High Electron Mobility Transistors (GaAs PHEMT), Gallium Arsenide Heterojunction Bipolar Transistors (GaAs HBT), Gallium Nitride (GaN) transistors and Laterally-Diffused Metal Oxide Semiconductor (LDMOS) transistors capable of operating at the desired RF frequencies. As will be appreciated by persons of ordinary skill, other types of transistors capable of operating at the desired RF frequencies known in the art can also be used without departing from the spirit and scope of the present invention. In an embodiment of the present invention, wideband power amplifier 204 comprises a Gallium Nitride (GaN) transistor. In another embodiment of the present invention, wideband power amplifier 204 comprises a Gallium Arsenide (GaAs) transistor.

Wideband power amplifier 204 receives a bias voltage ($V_{cc}$) from power supply 206. In an embodiment, power supply 206 corresponds to a battery of a mobile communication device in which power amplifier circuit 200 is used. Power supply 206 provides the bias voltage ($V_{cc}$) equal to a first voltage level. In an embodiment, the first voltage level of the bias voltage ($V_{cc}$) provided by the battery of the mobile communication device is 3.6 V. A person ordinarily skilled in the art would appreciate and understand that other power sources known in the art and a voltage level other than 3.6 V can also be implemented without deviating from the scope of the present invention.

Power amplifier circuit 200 applies the amplified RF input signal $RF_{AMP}$ to the output load (not shown in FIG. 2). An output load corresponds to a circuit connected to an output terminal of a power amplifier and receives power from the power amplifier. In an embodiment of the present invention, a combination of a closed output switch and the corresponding harmonic filter corresponds to the output load. The output load connected to the output of wideband power amplifier 204 has an impedance, hereinafter referred to as a load impedance ($R_L$). Load impedance ($R_L$) of the output load is equal to a first load impedance. A value of the first load impedance of the output load is based at least in part on a pre-defined value of return loss at the output of wideband power amplifier 204. In an embodiment of the present invention, the value of the first load impedance ($R_L$) of the output load is equal to 50 ohm when the pre-defined value of return loss at the output of the wideband power amplifier 204 is less than −10 decibels, i.e. Θ10 db. In another embodiment of the present invention, the value of the first load impedance ($R_L$) of the output load lies in the range of 20 ohm to 110 ohm when the pre-defined value of return loss at the output of the wideband power amplifier 204 is less than −10 decibels, i.e. Θ10 db.

Wideband power amplifier 204 is configured for providing a predetermined output power to the output load. Output power ($P_{out}$) provided by wideband power amplifier 204 is a function of a bias voltage ($V_{cc}$) applied to wideband power amplifier 204 and an output impedance ($R_S$) of wideband power amplifier 204. The output power ($P_{out}$) of wideband power amplifier 204 can be expressed by equation 1 as $P_{out} = V_{cc}^2/(2 R_S)$.

To maximize the output power ($P_{out}$) delivered by wideband power amplifier 204, the output impedance ($R_S$) of wideband power amplifier 204 should be equal to the first load impedance ($R_L$) of the load. In an embodiment of the present invention, the value of the first load impedance ($R_L$) of the output load is equal to 50 ohm when the pre-defined value of return loss at the output of the wideband power amplifier is less than −10 decibels, i.e. Θ−10 db. Wideband power amplifier 204 is configured to have a constant output impedance ($R_S$) having a high impedance value. The constant output impedance ($R_S$) of wideband power amplifier 204 is equal to the first load impedance ($R_L$) of the output load. In an embodiment, the constant output impedance ($R_S$) of wideband power amplifier 204 is equal to 50 ohm. The constant output impedance ($R_S$) equal to 50 ohm is obtained by adjusting a power amplifier load line to a constant 50 ohm by varying the bias voltage ($V_{cc}$) applied to wideband power amplifier 204. For example, in an embodiment, when the predetermined output power ($P_{out}$) to be provided to the output load is equal to 4 W and the output impedance ($R_S$) of wideband power amplifier 204 is made equal to the first load impedance ($R_L$) of the output load, i.e. the constant output impedance ($R_S$) of wideband power amplifier 204 is equal to 50 ohm, then according to equation 1 described above, the bias voltage ($V_{cc}$) required by wideband power amplifier 204 is equal to 20V. However, in an embodiment, the bias voltage ($V_{cc}$) provided by power supply 206, such as a battery of a mobile communication device, is generally equal to 3.6V. Thus, the bias voltage ($V_{cc}$) applied to wideband power amplifier 204 needs to be increased from 3.6 V to 20V.

Power controller 208 is configured for changing the bias voltage ($V_{oo}$) provided by power supply 206 to wideband power amplifier 204. In an embodiment of the present invention, power controller 208 is a boost DC-DC converter. In another embodiment of the present invention, power controller 208 is a buck-boost DC-DC converter. A person ordinarily skilled in the art would appreciate and understand that other voltage controllers known in the art can also be implemented without deviating from the scope of the present invention. Power controller 208 changes the bias voltage ($V_{cc}$) provided by power supply 206 from the first voltage level to a second voltage level. The second voltage level of the bias voltage ($V_{cc}$) corresponds to the bias voltage ($V_{cc}$) required by wideband power amplifier 204 for providing the predetermined output power ($P_{out}$) with the output impedance ($R_S$) of wideband power amplifier 204 being equal to the load impedance ($R_L$) of the output load. In an embodiment, for example to provide a predetermined 4 W output power ($P_{out}$) with output impedance ($R_S$) of wideband power amplifier 204 being equal to 50 ohm, power controller 208 increases the bias voltage ($V_{cc}$) from the first voltage level equal to 3.6V to the second voltage level 20V. Moreover, when power controller 208 changes the bias voltage ($V_{cc}$) from the first voltage level to the second voltage level the output impedance ($R_S$) of wideband power amplifier 204 remains equal to the load impedance ($R_L$) of the output load.

In an embodiment of the invention, power controller 208 is coupled to wideband power amplifier 204 through a first switch 210. When first switch 210 is turned on, power controller 208 is connected to wideband power amplifier 204 and provides the bias voltage ($V_{cc}$) from power supply 206 to wideband power amplifier 204. In another embodiment of the present invention, power supply 206 is directly coupled to wideband amplifier 204 through second switch 212. When the second voltage level of the bias voltage ($V_{cc}$) required by wideband power amplifier 204 to provide the predetermined output power ($P_{out}$) is less than or equal to the first voltage level of the bias voltage ($V_{cc}$), first switch 210 is switched off to disconnect power controller 208 from wideband power amplifier 204 and second switch 212 is switched on to directly couple power supply 206 to wideband amplifier 204. As a result, power controller 208 is by-passed by second switch 212. By disconnecting power controller 208 when low bias voltage is required, the amplification efficiency of power amplifier circuit 200 is improved.

Additionally, when the required predetermined output power ($P_{out}$) is low and power controller 208 changes the required bias voltage ($V_{cc}$), the RF input signal RFIN applied to wideband power amplifier 204 needs to be controlled. When the required bias voltage ($V_{cc}$) is reduced, the RF input signal RFIN applied to wideband power amplifier 204 is also reduced to prevent damage to wideband power amplifier 204. Voltage gain control amplifier 202 controls gain of the RF input signal RFIN and thereby reduces the RF input signal within a range required for efficient operation of wideband power amplifier 204. In an embodiment of the present invention, voltage gain control amplifier 202 comprises a transistor made from Silicon on Insulator (SOI) technology. A person ordinarily skilled in the art would appreciate and understand that types of transistors known in the art can also be implemented without deviating from the scope of the present invention.

In another embodiment of the present invention, power amplifier circuit 200 further comprises secondary power amplifier 218 configured for amplifying a very low power RF input signal. In an embodiment of the present invention, secondary power amplifier 218 comprises a transistor made from Silicon on Insulator (SOI) technology. As will be appreciated by persons of ordinary skill, other types of transistors known in the art can also be used without departing from the spirit and scope of the present invention. Secondary power amplifier 218 is configured to have high output impedance and is capable of operating over a wide frequency range. The very low power RF input signal corresponds to a RF input signal which provides a very small predetermined output power having a value in milli-watt. When a very low power RF input signal to be amplified is applied to an input terminal of power amplifier circuit 200, secondary switch 220 is switched on and the very low power RF input signal is applied to the input terminal of secondary power amplifier 218. Secondary power amplifier 218 amplifies the very low power RF input signal and the amplified very low power RF input signal is applied to plurality of harmonic filters 214a, 214b, 214c and 214n through plurality of output switches 216a, 216b, 216c and 216n. Thus, secondary power amplifier 218 by-passes wideband power amplifier 204 and power controller 208 when very low power RF input signal is to be amplified. Disconnecting power controller 208 when amplifying very low power RF input signal reduces quiescent power consumed by power controller 208 at very low predetermined output power.

Power amplifier circuit 200 further includes plurality of harmonic filters 214a, 214b, 214c and 214n and plurality of output switches 216a, 216b, 216c and 216n. Each harmonic filter of plurality of harmonic filters 214a, 214b, 214c and 214n is configured for filtering a predefined frequency band corresponding to the each harmonic filter. The pre-defined frequency band filtered by each harmonic filter depends at least on design of the each harmonic filter. In various embodiments of the present invention, each harmonic filter of plurality of harmonic filters 214a, 214b, 214c and 214n corresponds to at least one of a low pass filter, a high pass filter, a band pass filter, a Surface Acoustic Wave (SAW) filter, diplex filter, etc. Plurality of harmonic filters 214a, 214b, 214c and 214n are coupled to the output of wideband power amplifier 204 through plurality of output switches 216a, 216b, 216c and 216n.

Each output switch of plurality of output switches 216a, 216b, 216c and 216n is made from a technology selected from a group comprising of Gallium Arsenide Pseudomorphic High Electron Mobility Transistor (GaAs PHEMT) technology, Gallium Nitride Pseudomorphic High Electron Mobility Transistor (GaN PHEMT) technology, Silicon Laterally-Diffused Metal Oxide Semiconductor (Si LDMOS) technology, Silicon on Insulator (SOI) technology, Silicon on Sapphire (SOS) technology and MicroElectroMechanical Systems (MEMS) technology. As will be appreciated by persons of ordinary skill, other technologies known in the art can also be used for making the output switches without departing from the spirit and scope of the present invention.

Output switches 216a, 216b, 216c and 216n are coupled to the output terminal of wideband power amplifier 204 and receive an amplified RF input signal $RF_{AMP}$. Each output switch of plurality of output switches 216a, 216b, 216c and 216n connects the amplified RF input signal $RF_{AMP}$ of a predefined frequency band corresponding to a harmonic filter to the corresponding harmonic filter. For example, when wideband power amplifier 204 provides an amplified 900 MHz GSM frequency band at the output and harmonic filter 214a is configured for filtering a 900 MHz GSM frequency band, output switch 216a is switched on to connect the amplified 900 MHz GSM frequency band to harmonic filter 214a for filtering.

Moreover, each harmonic filter is independent of other harmonic filters. Filtering of a pre-defined frequency band by a harmonic filter is independent of the filtering of other frequency bands by the other harmonic filters. Each output switch can be optimized for the pre-defined frequency band corresponding to the each harmonic filter connected to the each output switch independent of the other output switches. In an embodiment of the present invention, power amplifier circuit 200 further comprises an impedance matching circuit coupled to each harmonic filter for matching a second load impedance of the output load to the output impedance of wideband power amplifier 204 when the second load impedance of the output load is unequal to the first load impedance of the output load. Usually, an impedance matching circuit comprises one or more series inductors, one or more shunt capacitors or a combination thereof. For example, when a predetermined output power is to be provided at output switch 216a for a pre-defined frequency band corresponding to harmonic filter 214a, an impedance matching circuit can be coupled in between wideband power amplifier 204 and harmonic filter 214a for additionally matching a load impedance of harmonic filter 214a to the output impedance of wideband power amplifier 204. Since the output impedance of wideband power amplifier 204 has a high value, the additional impedance required for matching the load impedance of harmonic filter 214a to the output impedance of wideband power amplifier 204 will be small as compared to the output impedance of wideband power amplifier 204. When a small series inductor is added to the high output impedance of wideband power amplifier 204, the power loss of the small series inductor will not have significant effect on the amplification efficiency of wideband power amplifier 204. This allows impedance matching and filtering to be independently performed for each switch and the corresponding harmonic filter.

Although power amplifier circuit 200 as illustrated in FIG. 2 includes a single RF input signal RFIN applied at the input terminal of power amplifier circuit 200, the present invention is not limited to power amplifier circuit having a single RF input signal RFIN. It will be apparent to those skilled in the art that the power amplifier circuit described in conjunction with FIG. 2 can amplify more than one RF input signal RFIN applied to its input terminal without departing from the basic scope and spirit of the invention. A power amplifier circuit with multiple RF input signals is explained in conjunction with FIG. 3.

Figure 3:
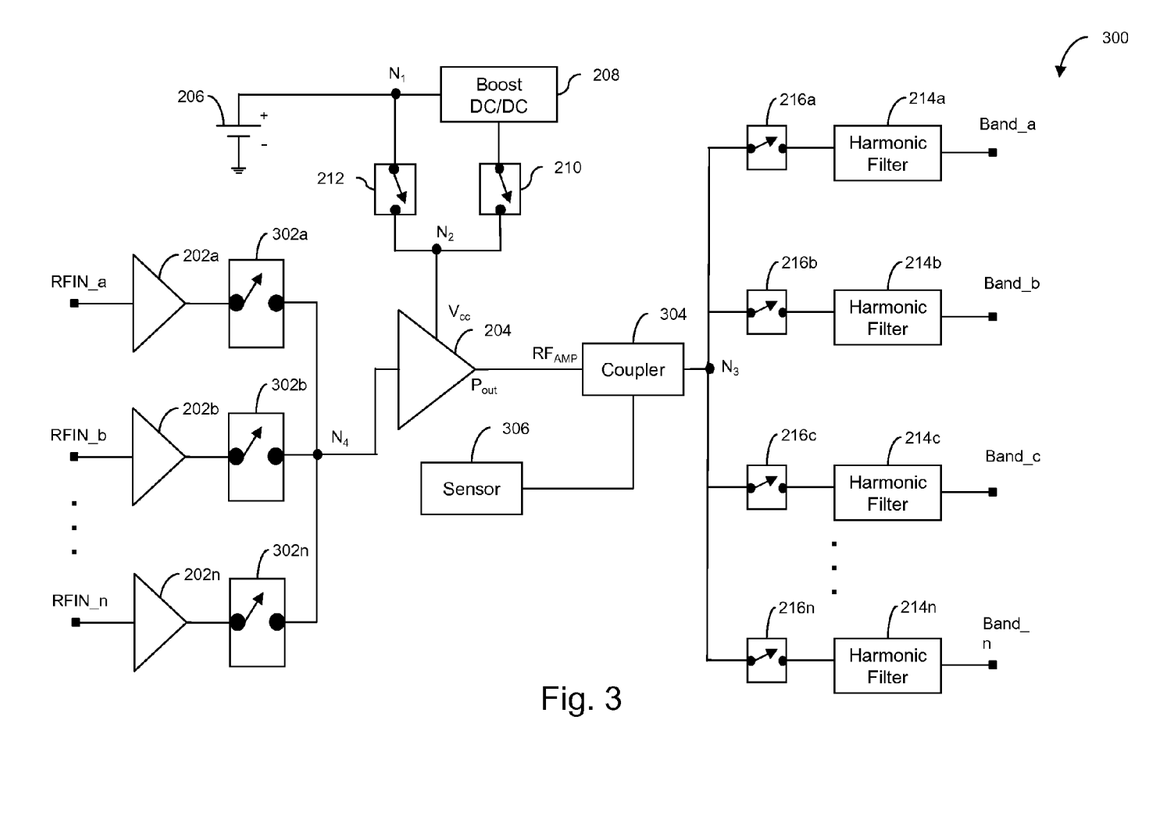
FIG. 3 is a schematic circuit diagram of a MMMB RF power amplifier circuit in accordance with another embodiment of the present invention.

FIG. 3 is a schematic representation of a circuit diagram of a MMMB RF power amplifier circuit 300, in accordance with another embodiment of the invention. Power amplifier circuit 300 includes the elements illustrated to be a part of power amplifier circuit 200 (refer to FIG. 2) and using the same reference numbers, except for secondary power amplifier 218 and secondary switch 220 which have been eliminated. Voltage gain control amplifiers 202a, 202b and 202n, a plurality of third switches 302a, 302b and 302n, a coupler 304 and a sensor 306 have been added.

Further, component connection configuration of components shown to be identical in power amplifier circuit 200 and power amplifier circuit 300 is identical. Additionally, each RF input signals of RF input signals RFIN_a, RFIN_b and RFIN_n to be amplified is applied to an input terminal of each voltage gain control amplifier of voltage gain control amplifiers 202a, 202b and 202n. An output terminal of each voltage gain control amplifier of plurality of voltage gain control amplifiers 202a, 202b and 202n is coupled to a first terminal of third switch 302a, 302b and 302n respectively. A second terminal of each of third switch 302a, 302b and 302n is coupled at a fourth common node $N_4$. The fourth common node $N_4$ is connected to the input terminal of wideband power amplifier 204. The output terminal of wideband power amplifier 204 is connected to a first terminal of coupler 304. A second terminal of coupler 304 is connected to the third common node $N_3$. Further, a first terminal of sensor 306 is connected to a third terminal of coupler 304.

As described above in conjunction with FIG. 2, wideband power amplifier 204 amplifies the RF input signal RFIN. The RF input signal selected from plurality of RF input signals RFIN_a, RFIN_b and RFIN_n is applied to the input terminal of wideband power amplifier 204 by closing a third switch of third switches 302a, 302b and 302n corresponding to the selected RF input signal. For example, when RF input signal RFIN_a is to be amplified third switch 302a is switched on. As a result, RF input signal RFIN_a is applied to the input terminal of wideband power amplifier 204.

Wideband power amplifier 204 amplifies the selected RF input signal and the amplified RF input signal $RF_{AMP}$ is applied to coupler 304. In an embodiment of the present invention, coupler 304 is a directional coupler. As will be appreciated by persons of ordinary skill, other types of couplers known in the art can also be used without departing from the spirit and scope of the present invention. Coupler 304 couples a defined amount of output power provided by wideband power amplifier 204 to sensor 306. Sensor 306 senses the defined amount of output power and measures the output power provided by wideband power amplifier 204. Various types of sensors known in the art such as a thermocouple sensor, a diode sensor, a thermistor, etc. can be used.

Moreover, power amplifier circuit 200 as illustrated in FIG. 2 and power amplifier circuit 300 as illustrated in FIG. 3 show a power amplifier circuit comprising a single output stage providing amplified RF input signal $RF_{AMP}$ to plurality of output switches 216a, 216b, 216c and 216n. However, the present invention is not limited to a single output stage. It will be apparent to those skilled in the art that a power amplifier circuit comprising a plurality of output stages can be provided without departing from the basic scope and spirit of the invention. In an embodiment of the present invention, the power amplifier circuit comprises a quadrature connected output stages.

Figure 4:
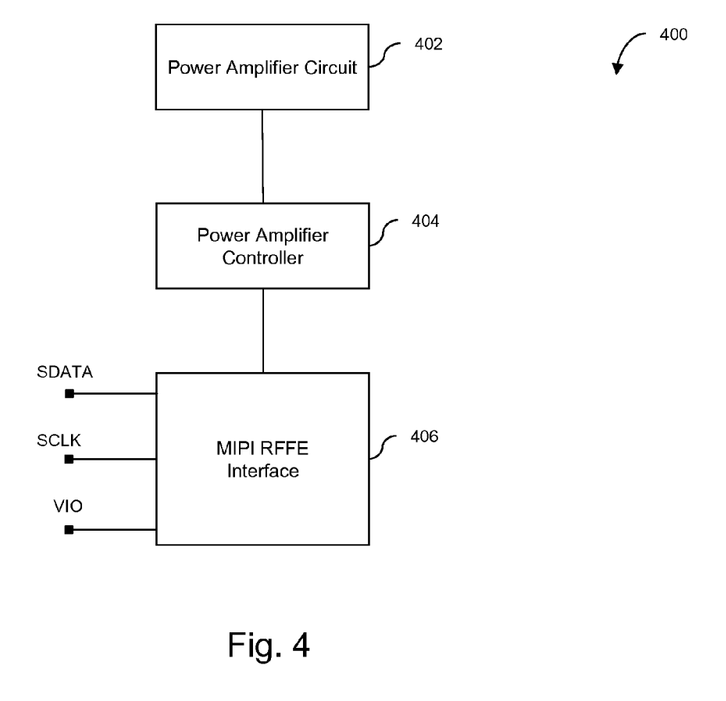
FIG. 4 is a block diagram of a digital controller in accordance with an embodiment of the present invention.

Moreover, power amplifier circuit 200 as illustrated in FIG. 2 and power amplifier circuit 300 as illustrated in FIG. 3 can be digitally controlled by a power amplifier controller as explained in conjunction with FIG. 4.

FIG. 4 is a block diagram of a digital controller in accordance with an embodiment of the present invention. FIG. 4 will be explained in conjunction with FIG. 2 and FIG. 3. In an embodiment, the digital controller is a Mobile Industry Processor Interface (MIPI) RF Front-End Control Interface (RFFE), hereinafter referred to as MIPI RFFE interface. As will be appreciated by persons of ordinary skill, other types of digital interface known in the art can also be used without departing from the spirit and scope of the present invention. FIG. 4 comprises a power amplifier circuit 402, a power amplifier controller 404 and a MIPI RFFE interface 406. Power amplifier circuit 402 corresponds to power amplifier circuit 200 and power amplifier circuit 300 explained in conjunction with FIG. 2 and FIG. 3 respectively. MIPI RFFE interface 406 controls components of the power amplifier circuit 402. MIPI RFFE interface 406 controls biasing of wideband power amplifier 204, switching of plurality of output switches 216a, 216b, 216c and 216n and operation of power controller 208. MIPI RFFE interface 406 comprises a clock signal (SCLK) controlled by a master, a unidirectional or bidirectional data signal (SDATA) and an input/output supply reference voltage (VIO). MIPI RFFE interface 406 provides control signals to power amplifier controller 404 which controls RF power amplifier circuit 402.

In another embodiment of the present invention, power amplifier circuit 200 and power amplifier circuit 300 explained in conjunction with FIG. 2 and FIG. 3 respectively can be controlled by a standard logic control circuit. In still another embodiment of the present invention, power amplifier circuit 200 and power amplifier circuit 300 explained in conjunction with FIG. 2 and FIG. 3 respectively can be controlled by a Serial Peripheral Interface (SPI) control. It will be apparent to those skilled in the art that other control interfaces can be used without departing from the basic scope and spirit of the invention.

The embodiments of the present invention provide several advantages. The power amplifier circuit is compact since it includes a single wideband power amplifier which can operate at multiple frequency bands and multiple communication standards. Further, since the power amplifier circuit includes a high impedance wideband power amplifier, the need of a impedance matching circuit for matching high load impedance of a load with low output impedance of power amplifier is eliminated. Hence, power loss occurring in the impedance matching circuit is avoided and amplification efficiency of the power amplifier circuit is improved. As a result, the battery life is increased.

While various embodiments of the present invention have been illustrated and described, it will be clear that the invention is not limited to these embodiments only. Numerous modifications, changes, variations, substitutions and equivalents will be apparent to those skilled in the art, without departing from the basic scope and spirit of the invention, as described in the claims that follow.

What is claimed is:

1. A power amplifier circuit for amplifying at least one radio frequency (RF) signal applied to an output load, the power amplifier circuit operating at a plurality of frequency bands, the power amplifier circuit comprising:
    a wideband power amplifier configured to have a constant output impedance, wherein the constant output impedance of the wideband power amplifier is equal to a load impedance of the output load;
    a power controller configured for changing a bias voltage provided by a power supply to the wideband power amplifier, wherein the output impedance of the wideband power amplifier remains equal to the load impedance of the output load when the power controller changes the bias voltage from a first voltage level to a second voltage level; and
    a secondary power amplifier configured for amplifying a low power radio frequency signal, the secondary power amplifier by-passing the wideband power amplifier when the low power radio frequency signal is to be amplified.

2. The power amplifier circuit of claim 1, wherein the second voltage level is equal to the bias voltage required by the wideband power amplifier for providing a predetermined output power with the output impedance of the wideband power amplifier being equal to the load impedance of the output load.

3. The power amplifier circuit of claim 1, wherein the value of the constant output impedance is based at least in part on a pre-defined value of return loss at an output of the wideband power amplifier.

4. The power amplifier circuit of claim 2, wherein the value of the constant output impedance lies in the range of 20 ohms to 110 ohms when the pre-defined value of return loss at the output of the wideband power amplifier is less than −10 decibels.

5. The power amplifier circuit of claim 1, wherein the power controller is a boost DC-DC converter.

6. The power amplifier circuit of claim 1 further comprising:
    a plurality of harmonic filters, wherein each harmonic filter of the plurality of harmonic filters is configured for filtering a pre-defined frequency band of the plurality of the frequency bands corresponding to the each harmonic filter;
    a plurality of output switches, wherein each output switch of the plurality of output switches allows each harmonic filter of the plurality of harmonic filters to receive the corresponding frequency band from an output of the wideband power amplifier; and
    wherein filtering of a frequency band of the plurality of frequency band is independent of the filtering of other frequency bands of the plurality of frequency band.

7. The power amplifier circuit of claim 6, wherein the each output switch of the plurality of output switches is independently optimized for the frequency band corresponding to the harmonic filter connected to each output switch.

8. The power amplifier circuit of claim 6, wherein the output switch is made from a technology selected from the group consisting of: Gallium Arsenide Pseudomorphic High Electron Mobility Transistor (GaAs PHEMT) technology, Gallium Nitride Pseudomorphic High Electron Mobility Transistor (GaN PHEMT) technology, Silicon Laterally-Diffused Metal Oxide Semiconductor (Si LDMOS) technology, Silicon on Insulators (SOI) technology, Silicon on Sapphire (SOS) technology and MicroElectroMechanical Systems (MEMS) technology.

9. The power amplifier circuit of claim 1, wherein the wideband power amplifier comprises at least one of Gallium Arsenide Pseudomorphic High Electron Mobility Transistors (GaAs PHEMT), Gallium Arsenide Heterojunction Bipolar Transistors (GaAs HBT), Gallium Nitride (GaN) transistors and Laterally-Diffused Metal Oxide Semiconductor (LDMOS) transistors.

10. The power amplifier circuit of claim 1 further comprising:
a wideband radio frequency coupler connected to the output of the wideband power amplifier, the band radio frequency coupler configured for sampling the output power of the wideband power amplifier; and
a sensor coupled to the wideband radio frequency coupler, the sensor configured for measuring the output power of the wideband power amplifier sampled by the wideband radio frequency coupler.

11. A multimode multiband radio frequency power amplifier circuit for amplifying at least one radio frequency (RF) signal applied to an output load, the power amplifier circuit comprising:
a wideband power amplifier configured for providing a predetermined output power to the output load, wherein the wideband power amplifier has an output impedance, the wideband power amplifier receiving a bias voltage from a power supply;
a DC-DC boost converter for increasing the bias voltage received by the wideband power amplifier from a first voltage level to a second voltage level, wherein the second voltage level is equal to the bias voltage required by the wideband power amplifier for providing the predetermined output power with the output impedance of the wideband power amplifier being equal to a first load impedance of the output load;
a plurality of harmonic filters, the plurality of harmonic filters coupled to the output of the wideband power amplifier, wherein each harmonic filter of the plurality of harmonic filters is configured for filtering a pre-defined frequency band corresponding to the each harmonic filter; and
a plurality of output switches, wherein each output switch of the plurality of output switches allows the each harmonic filter of the plurality of harmonic filters to receive the corresponding predefined frequency band from the output terminal of the wideband power amplifier.

12. The power amplifier circuit of claim 11, wherein value of the first load impedance of the output load is based at least in part on a pre-defined value of return loss at an output of the wideband power amplifier.

13. The power amplifier circuit of claim 12, wherein the value of the first load impedance of the output load lies in the range of 20 ohms to 110 ohms when the pre-defined value of return loss at the output of the wideband power amplifier is less than −10 decibels.

14. The power amplifier circuit of claim 11, wherein the each output switch of the plurality of output switches is optimized for the predefined frequency band corresponding to the each harmonic filter connected to the each output switch independent of the other output switches of the plurality of output switches.

15. The power amplifier circuit of claim 11, wherein the each output switch of the plurality of output switches is made from a technology selected from the group consisting of: Gallium Arsenide Pseudomorphic High Electron Mobility Transistor (GaAs PHEMT) technology, Gallium Nitride Pseudomorphic High Electron Mobility Transistor (GaN PHEMT) technology, Silicon Laterally-Diffused Metal Oxide Semiconductor (Si LDMOS) technology, Silicon on Insulators (SOI) technology, Silicon on Sapphire (SOS) technology and MicroElectroMechanical Systems (MEMS) technology.

16. The power amplifier circuit of claim 11, wherein the wideband power amplifier comprises at least one transistor selected from a group consisting of: Gallium Arsenide Pseudomorphic High Electron Mobility Transistors (GaAs PHEMT), Gallium Arsenide Heterojunction Bipolar Transistors (GaAs HBT), Gallium Nitride (GaN) transistors and Laterally-Diffused Metal Oxide Semiconductor (LDMOS) transistors.

17. The power amplifier circuit of claim 11 further comprising:
a secondary power amplifier configured for amplifying a very low power radio frequency signal, wherein the secondary power amplifier by-passes the wideband power amplifier when a low power radio frequency signal is to be amplified.

18. The power amplifier circuit of claim 11 further comprising:
a wideband radio frequency coupler connected to the output of the wideband power amplifier, the band radio frequency coupler is configured for sampling the output power of the wideband power amplifier; and
a sensor coupled to the wideband radio frequency coupler, the sensor is configured for measuring the output power of the wideband power amplifier sampled by the wideband radio frequency coupler.

19. The power amplifier of claim 11 further comprising:
an impedance matching circuit, wherein the impedance matching circuit matches a second load impedance of the output load to the output impedance of the wideband power amplifier when the second load impedance of the output load is unequal to the first load impedance of the output load.

* * * * *